US009601417B2

United States Patent
Na et al.

(10) Patent No.: US 9,601,417 B2
(45) Date of Patent: Mar. 21, 2017

(54) "L" SHAPED LEAD INTEGRATED CIRCUIT PACKAGE

(75) Inventors: Hanjoo Na, Fremont, CA (US); Santosh Kumar, Santa Clara, CA (US)

(73) Assignee: Unigen Corporation, Fremont, CA (US)

( * ) Notice: Subject to any disclaimer, the term of this patent is extended or adjusted under 35 U.S.C. 154(b) by 827 days.

(21) Appl. No.: 13/187,380

(22) Filed: Jul. 20, 2011

(65) Prior Publication Data
US 2013/0020695 A1  Jan. 24, 2013

(51) Int. Cl.
H01L 23/02 (2006.01)
H01L 23/495 (2006.01)

(52) U.S. Cl.
CPC ......... *H01L 23/49555* (2013.01); *H01L 2224/48091* (2013.01); *H01L 2224/48247* (2013.01); *H01L 2224/48465* (2013.01); *H01L 2924/1815* (2013.01)

(58) Field of Classification Search
None
See application file for complete search history.

(56) References Cited

U.S. PATENT DOCUMENTS

| 4,710,680 | A | * | 12/1987 | Nakatani et al. | 315/169.4 |
| 4,994,896 | A | * | 2/1991 | Uemura et al. | 257/724 |
| 5,127,447 | A | * | 7/1992 | Furudate et al. | 140/105 |
| 5,151,559 | A | * | 9/1992 | Conru et al. | 174/529 |
| 5,227,664 | A | * | 7/1993 | Toshio et al. | 257/723 |
| 5,303,120 | A | * | 4/1994 | Michii et al. | 361/760 |
| 5,309,020 | A | * | 5/1994 | Murasawa et al. | 257/685 |
| 5,387,762 | A | * | 2/1995 | Hasegawa et al. | 174/533 |
| 5,446,623 | A | * | 8/1995 | Kanetake | 361/760 |
| 5,451,716 | A | * | 9/1995 | Hasegawa et al. | 174/527 |
| 5,679,978 | A | * | 10/1997 | Kawahara et al. | 257/697 |
| 5,742,097 | A | * | 4/1998 | Matsunaga et al. | 257/686 |
| 5,754,408 | A | * | 5/1998 | Derouiche | 361/773 |
| RE36,077 | E | * | 2/1999 | Michii et al. | 361/813 |
| 6,021,670 | A | * | 2/2000 | Takeuchi | 73/493 |
| 6,189,203 | B1 | * | 2/2001 | Heinrich et al. | 29/606 |
| 6,445,064 | B1 | * | 9/2002 | Ishii et al. | 257/686 |
| 6,458,617 | B1 | * | 10/2002 | Liao et al. | 438/51 |
| 6,588,132 | B2 | * | 7/2003 | Tsuji | 40/451 |
| 6,603,404 | B1 | * | 8/2003 | Tsuji | 340/815.4 |
| 6,607,937 | B1 | * | 8/2003 | Corisis | 438/108 |
| 6,670,701 | B2 | * | 12/2003 | Matsuura et al. | 257/686 |
| 6,737,738 | B2 | * | 5/2004 | Koh et al. | 257/686 |
| 6,777,798 | B2 | * | 8/2004 | Fukumoto et al. | 257/686 |
| 6,798,056 | B2 | * | 9/2004 | Matsuura et al. | 257/686 |

(Continued)

FOREIGN PATENT DOCUMENTS

| JP | 61069159 A | * | 4/1986 | H01L 23/48 |
| JP | 02071551 A | * | 3/1990 | |

(Continued)

*Primary Examiner* — David E Graybill
(74) *Attorney, Agent, or Firm* — Carr & Ferrell LLP

(57) ABSTRACT

Various aspects provide for bending a bending a lead frame of a semiconductor device package into a shape of an "L" and mounting the package on a substrate. A horizontal portion of the bent lead-frame is about parallel with a surface of the package. A vertical portion of the bent lead frame is configured to extend the horizontal portion beyond the surface of the package. A device may be mounted between the substrate and the package.

19 Claims, 7 Drawing Sheets

(56) References Cited

U.S. PATENT DOCUMENTS

| | | | |
|---|---|---|---|
| 6,844,616 B2* | 1/2005 | Liao et al. | 257/676 |
| 7,180,166 B2* | 2/2007 | Ho et al. | 257/686 |
| 7,235,871 B2* | 6/2007 | Corisis | 257/686 |
| 7,247,934 B2* | 7/2007 | Pu | 257/686 |
| 7,388,280 B2* | 6/2008 | Shim et al. | 257/666 |
| 7,622,800 B2* | 11/2009 | Ramakrishna et al. | 257/686 |
| 7,785,929 B2* | 8/2010 | Camacho et al. | 438/112 |
| 7,804,280 B2 | 9/2010 | Deaver, Sr. et al. | |
| 7,855,444 B2* | 12/2010 | Camacho et al. | 257/686 |
| 7,981,702 B2* | 7/2011 | Ho et al. | 438/15 |
| 7,986,043 B2* | 7/2011 | Merilo et al. | 257/777 |
| 8,067,827 B2* | 11/2011 | Corisis | 257/686 |
| 8,310,098 B2 | 11/2012 | Kumar et al. | |
| 8,358,017 B2* | 1/2013 | Tsui | 257/778 |
| 2002/0000056 A1* | 1/2002 | Tsuji | 40/451 |
| 2002/0089048 A1* | 7/2002 | Liao et al. | 257/678 |
| 2003/0127729 A1* | 7/2003 | Fukumoto et al. | 257/723 |
| 2005/0253224 A1* | 11/2005 | Ho et al. | 257/666 |
| 2006/0059396 A1* | 3/2006 | Ohbayashi | 714/726 |
| 2006/0091516 A1* | 5/2006 | Matsunami | 257/686 |
| 2006/0102994 A1* | 5/2006 | Pu | 257/686 |
| 2006/0197205 A1* | 9/2006 | Ramakrishna et al. | 257/686 |
| 2007/0228545 A1* | 10/2007 | Ramakrishna et al. | 257/686 |
| 2008/0203552 A1* | 8/2008 | Kim et al. | 257/686 |
| 2009/0283919 A1* | 11/2009 | Tsui et al. | 257/778 |
| 2010/0295379 A1 | 11/2010 | Garcia | |
| 2011/0215654 A1 | 9/2011 | Kumar et al. | |
| 2012/0024064 A1 | 2/2012 | Wu et al. | |
| 2012/0293012 A1 | 11/2012 | Kumar et al. | |
| 2013/0020695 A1* | 1/2013 | Na et al. | 257/696 |

FOREIGN PATENT DOCUMENTS

| | | | | |
|---|---|---|---|---|
| JP | 04159762 A | * | 6/1992 | H01L 23/50 |
| JP | 04367256 A | * | 12/1992 | H01L 23/50 |
| JP | 07147368 A | * | 6/1995 | H01L 23/50 |
| KR | 2002002825 A | * | 1/2002 | |

* cited by examiner

"L" SHAPED LEAD INTEGRATED CIRCUIT PACKAGE

BACKGROUND

1. Technical Field

The present invention relates to integrated circuit packaging, and more particularly to small outline packaging for surface mount integrated circuits.

2. Description of Related Art

Surface mount integrated circuits can be packaged in a Small Outline Package (SOP). An SOP includes Plastic Small Outline Package (PSOP), Thin Small Outline Package (TSOP), Shrink Small Outline Package (SSOP), Thin Shrink Small Outline Package (TSSOP), and Small Outline J-Lead Package (SOJ Package). These Small Outline Packages give users packaging choices for various types of integrated circuit and device applications. For example, SOPs support a wide range of nonvolatile memory component densities and features for user applications.

FIG. 1A illustrates a front elevation of a standard prior art TSOP 100. The TSOP 100 includes a case 102 and gull wing shaped lead-frame (leads) 104. The TSOP 100 may be mounted on a substrate 106, forming a separation 108 between the case 102 and substrate 106. A typical separation 108 is about 0 to 0.1 mm. Unfortunately, it is difficult to fit an additional device between the case 102 and substrate 106 due to the limited size of the separation 108. Further, the gull wing shape of the leads 104 provides an extension 110 from the sides of the case 102. A typical extension 110 is about 0.8 mm. Thus, a total extension 110 on two sides of the TSOP 100 can be about 1.6 mm or more. Such an extension 110 can result in the TSOP 100 occupying a footprint that is substantially greater than the area of the case 102. Thus, the extension 110 of the lead-frame 104 occupies substantial usable area on the substrate 106.

FIG. 1B illustrates a front elevation of a prior art SOJ Package 120. The SOJ Package 120 includes a case 122 and leads 124. The leads 124 are configured in the shape of a "J." Unfortunately, for similar reasons as discussed above with respect to TSOP 100, it is difficult to fit an additional device under the case 122. Moreover, the curved portion of the J shaped leads 124 complicates mounting to a flat substrate.

SUMMARY

Clearance for fitting an additional device between a package and a substrate may be provided by using an "L" shaped lead on an SOP. The "L" shape lead has a horizontal portion about parallel to the substrate for attachment to the substrate and a vertical portion configured for providing a separation between a case of the package and the substrate. An "L" shaped lead SOP may be manufactured using "L" shaped leads. Alternatively, a standard SOP may be converted to an "L" shaped lead SOP by reforming the leads into the shape of an "L." For example, the leads may be bent into an "L" shape. In some embodiments, the leads are bent upward and an inverted "L" is formed above the top of the case to make a reverse SOP. The reverse SOP may be inverted and mounted on the substrate. A layout of devices and traces on the substrate may be configured for the reverse SOP while taking advantages of the decreased footprint of the "L" shaped leads of the SOP and additional space for devices under the "L" shaped lead SOP.

In various embodiments, a small outline package for supporting a semiconductor is disclosed. The package comprises a case enclosing the semiconductor and an "L" shaped lead-frame connected to the semiconductor and supported by the case. The lead-frame has a horizontal portion configured for attachment to a substrate and a vertical portion configured for providing a separation between the case and the horizontal portion. The separation may be sized to provide clearance for mounting a device under the case. The small outline package may be attached to a substrate and a device may be mounted on the substrate between the small outline package and the substrate. In some embodiments, the vertical portion of the lead-frame is configured for inverting the small outline package to mount the "L" shaped lead-frame on the substrate, and "L" shaped lead-frame of the inverted package has a reversal of pins.

Various aspects of an electronic device comprise an integrated circuit enclosed in a case and an "L" shaped lead in electronic communication with the integrated circuit. A vertical portion of the lead extends from an edge of the case about perpendicular to a first surface of the case and a horizontal portion of the lead is bent under the case and is about parallel to the first surface of the case. The horizontal portion of the lead is separated from the first surface of case. In various embodiments, the first surface of the case is a top surface or a bottom surface. In some embodiments, the case is attached to a substrate and a device is attached to the substrate between the case and the substrate.

Various embodiments of the technology include a method for converting a small outline package to a reformed lead small outline package, the method includes bending a lead to form an "L" shape, having a horizontal portion of the "L" shape about parallel to a first surface of the package and a vertical portion of the "L" shape configured to position the horizontal portion beyond the first surface of the package. The method further includes mounting the reformed lead small outline package on a substrate and mounting a device between the reformed lead small outline package and the substrate. In various embodiments, the small outline package is a plastic small outline package, a thin small outline package, a thin shrink small outline package, or a shrink small outline package. The first surface of the package may be a bottom surface of the small outline package. In some embodiments, the first surface of the package is a top surface of the small outline package and the reformed small outline package is inverted to dispose the "L" leads on a substrate while the substrate is configured for a reversal of pins.

BRIEF DESCRIPTION OF THE DRAWINGS

Embodiments described herein may be referenced to any one or more of the following figures. Embodiments described herein may also be referenced by a combination of two or more of the following figures.

DETAILED DESCRIPTION

Figure 1A:
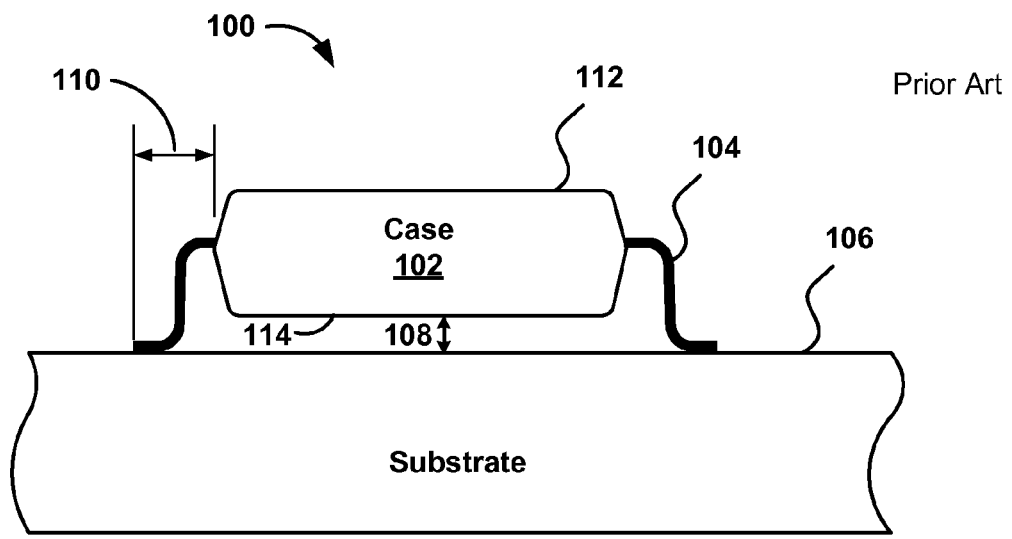
FIG. 1A illustrates a front elevation of a standard prior art TSOP.
Figure 1B:
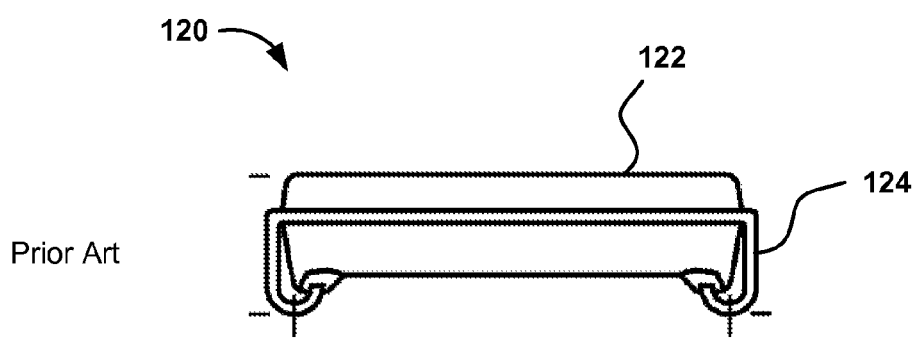
FIG. 1B illustrates a front elevation of a prior art SOJ Package.
Figure 2:
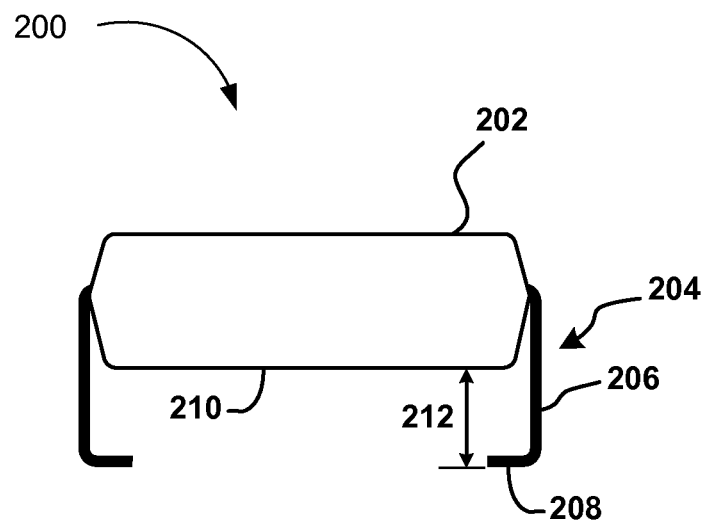
FIG. 2 illustrates a front elevation of an "L" shaped lead Small Outline Package (LSOP).

FIG. 2 illustrates a front elevation of an "L" shaped lead Small Outline Package (LSOP) 200. The LSOP 200 includes "L" shaped leads 204. The "L" shaped leads 204 include a vertical portion 206 and a horizontal portion 208. The horizontal portion 208 is oriented about parallel with the plane of a first surface of the case 202 for mounting on a substrate (illustrated elsewhere herein). The horizontal portion 208 is also oriented below a first surface 210. The orientation of the horizontal portion 208 below the first surface 210 instead of beyond the edge of the case 202 reduces an extension of the lead 204 beyond the edge of the case 202 to about 0 mm. The length of the vertical portion 206 provides a separation 212 between the first surface 210 and the horizontal portion 208. The separation 212 is greater than the separation 108 of the TSOP 100 FIG. 1. The case 202 of the LSOP 200 may be based on various types of SOP including PSOP, TSOP, SSOP, TSSOP, and the like.

Figure 3:
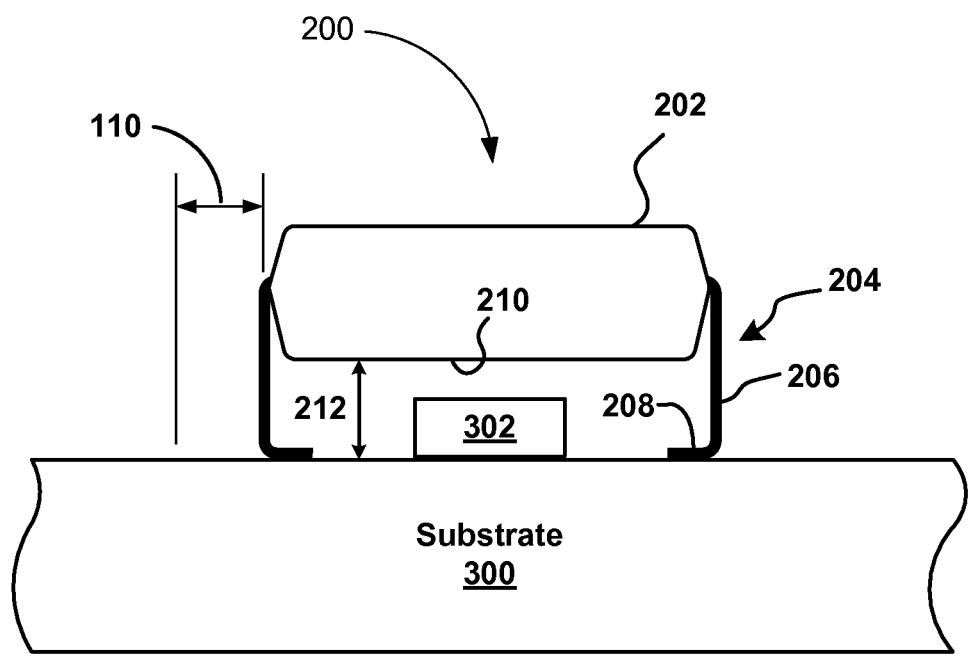
FIG. 3 illustrates a front elevation of the LSOP of FIG. 2 disposed on a substrate.

FIG. 3 illustrates a front elevation view of the LSOP 200 of FIG. 2 disposed on a substrate 300, in accordance with various aspects of the invention. A device 302 may be disposed between the substrate 300 and the case 202. A typical separation 212 is about 0.2-0.4 mm, which is substantially greater than a separation 108 of about 0.1 mm for a typical TSOP, as illustrated in FIG. 1A. A separation of about 0.4 mm is sufficient to accommodate various useful devices 302 between the case 202 and the substrate 300. In various embodiments, the device 302 includes active components such as bare dies, Chip Scale Package (CSP), diodes, transistors, etc. and passive components as X-tal, resistors, inductors, and capacitors etc.

FIG. 3 also illustrates additional space available for recapture from the extension 110 on the substrate 300 as a result of using an "L" shaped lead 204. This leads to higher device densities. For purposes of embodiments of the present invention, an "L" shaped lead means that the horizontal portion 208 of the "L" shaped lead is oriented for placement between a first surface of the case and a substrate. For example, in FIG. 3 the horizontal portion 208 of the lead 204 is between the first surface 210 of the case 202 and the substrate 300, instead of extending beyond the footprint of the case 202. A layout and traces on the substrate 300 may be configured to accommodate the higher device densities that lead to additional devices, including LSOP 200 devices that can be disposed in the space recaptured from the extensions 110. Further, the layout may be configured to accommodate devices 302 disposed between the LSOP 200 and the substrate 300. In various embodiments, the substrate 300 includes Printed Circuit Boards (PCB), multi-chip modules, chip-stack packages, daughter boards, perf board, wire wrap boards, stripboard, brassboards, hybrid integrated circuits, memory sticks, SD boards, micro SD's, piggybacked devices, and/or the like System in package (SIP)

Figure 4:
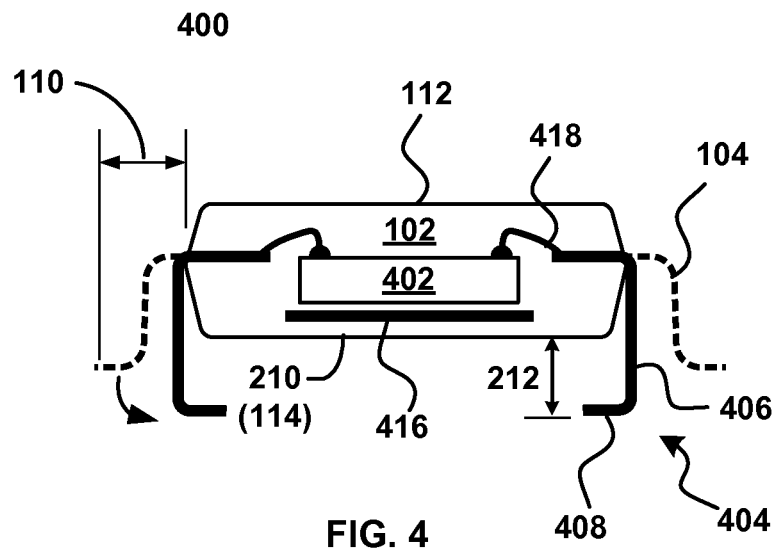
FIG. 4 illustrates reforming a TSOP of FIG. 1A into a reformed RLSOP (RLSOP).

FIG. 4 illustrates reforming a TSOP 100 of FIG. 1A into a reformed RLSOP 400 (RLSOP). FIG. 4 also illustrates internal components of the TSOP 100 including a die 402, a die attach pad 416 and connectors 418. The die 402 may be attached to the die attach pad 416 using an adhesive before being encased in the material of the case 202. The leads 104 of the TSOP 100 are illustrated in dotted line to illustrate their position before being bent and reformed into the "L" shape of the leads 404, including a vertical portion 406 and a horizontal portion 408, which are shown in solid line in the RLSOP 400 FIG. 4. The first surface 210 of the RLSOP 400 of FIG. 4 is a bottom surface 114 of the TSOP 100 as illustrated in FIG. 1A. Thus, FIG. 4 illustrates bending the leads 104 to form the vertical portion 406, which extends below the bottom surface 114 of the TSOP 100. FIG. 4 further illustrates bending the horizontal portion 408, to be about parallel to the first surface 210 of the RLSOP 400 (underneath the bottom surface 114).

Figure 5:
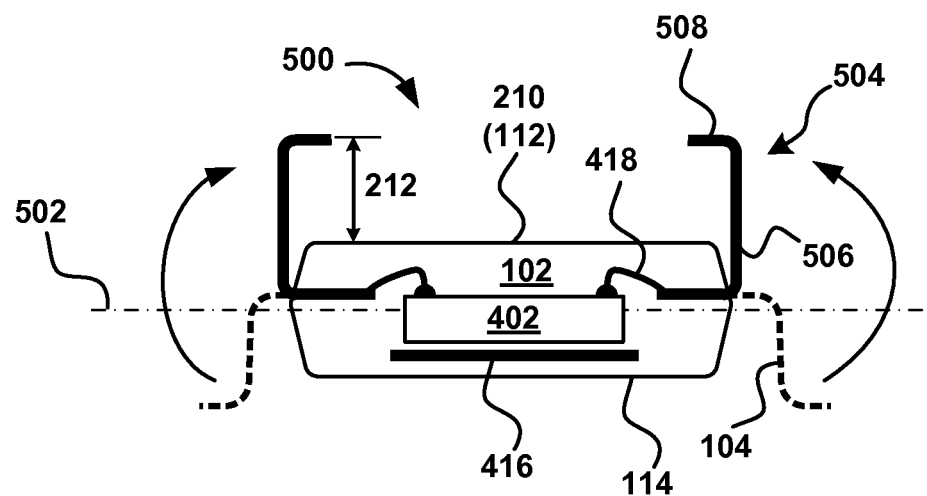
FIG. 5 illustrates reforming the TSOP of FIG. 1A into a reverse LSOP (RSOP).

FIG. 5 illustrates reforming the TSOP 100 of FIG. 1A into a reverse LSOP 500 (RSOP), according to aspects of the invention. "Reverse" may refer to the horizontal portion 508 being closest to the first surface 210. A dashed line 502 illustrates a horizontal plane at about a center of the case 102. The leads 104 of the TSOP 100 are illustrated in dotted line to illustrate their position before being bent and reformed into the shape of the "L" leads 504, which are shown in solid line in the RSOP 500 of FIG. 5. The first surface 210 of the RSOP 500 is a top surface 112 of the TSOP 100 as illustrated in FIG. 1A. Thus, FIG. 5 illustrates bending the leads 104 to form the vertical portion 506 of the leads 504 of the RSOP 500; the vertical portion 506 extends above the top surface 112 of the TSOP 100. FIG. 5 further illustrates bending the horizontal portion 508, to be about parallel to the first surface 210 of the RSOP 500 (above the top surface 112). As illustrated in FIG. 5, the lead-frame 104 is offset above the plane represented by dashed line 502. Thus, reforming the leads 104 into leads 504 above the top surface 112 may result in the separation 212 being greater for the RSOP 500 of FIG. 5 than the separation 212 for the RLSOP 400 of FIG. 4 that results from reforming the leads 104 into leads 404 below the bottom surface 114. While the RSOP 500 and the RLSOP 400 are illustrated in FIGS. 4-5 as being reformed by bending leads in the lead-frame, the RLSOP 400 and/or the RSOP 500 may be formed during manufacturing (e.g., LSOP 200).

Figure 6A:
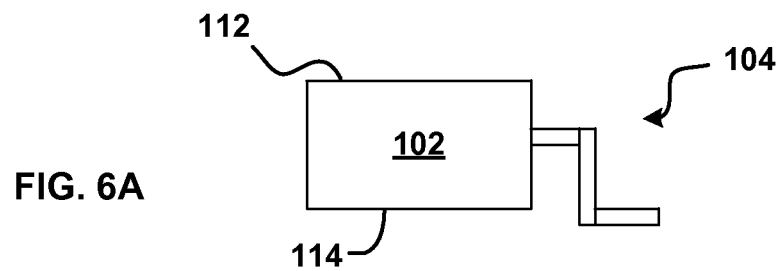
FIGS. 6A-D are block diagrams illustrating exemplary steps reforming a lead of FIG. 1 into a lead of FIG. 4.
Figure 6B:
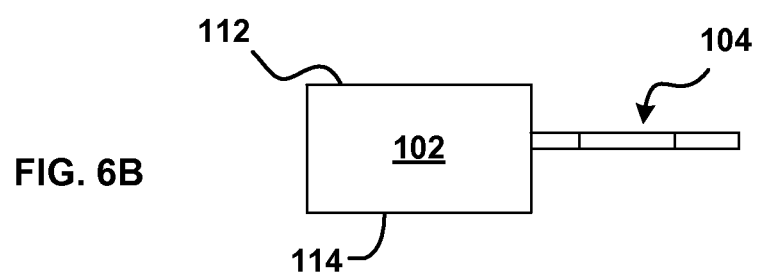
Figure 6C:
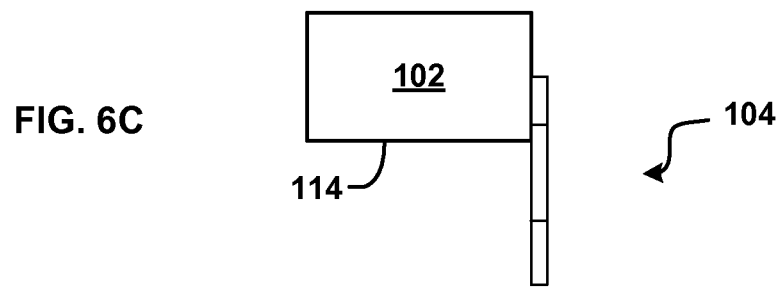
Figure 6D:
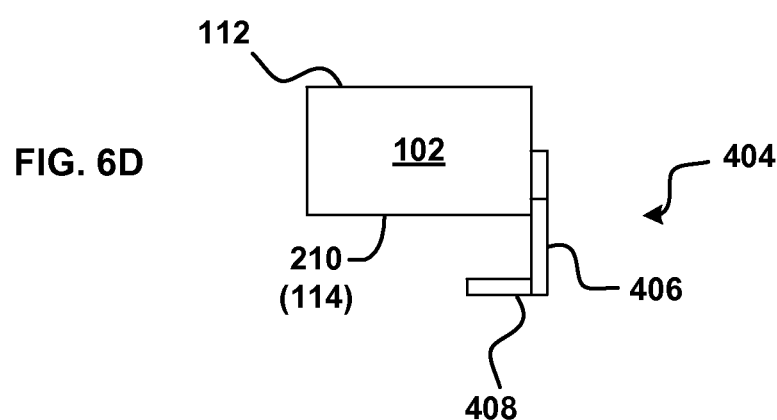

FIG. 6A-D are block diagrams illustrating exemplary steps reforming a lead 104 of FIG. 1 into a lead 404 of FIG. 4, according to aspects of the invention. Only one lead 104 is shown for clarity. FIG. 6A illustrates a block diagram of typical configuration for a case 102 the TSOP 100 of FIG. 1. In FIG. 6B, the entire lead 104 is straightened out to the side. In FIG. 6C, the straightened lead 104 is bent straight down, toward the bottom surface 114. In FIG. 6D, a horizontal portion 408 is formed under the bottom surface 114. The bottom surface 114 becomes the first surface 210 and the lead 104 of FIG. 1 becomes the lead 404 of FIG. 4. While FIGS. 6A-D illustrate various steps in reforming a lead, more, fewer or other steps may be used to reform leads of FIG. 1 into the leads of FIG. 4.

Figure 7A:
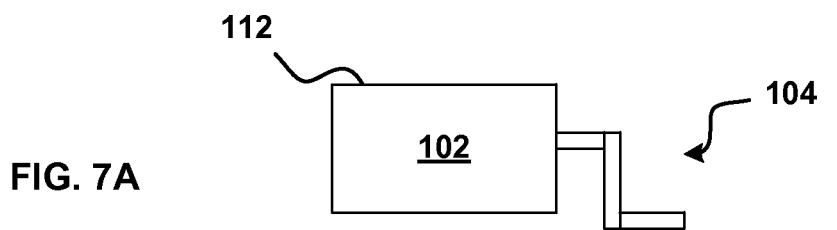
FIG. 7A-C are block diagrams illustrating exemplary steps reforming a lead 104 of FIG. 1 into a lead of FIG. 5.
Figure 7B:
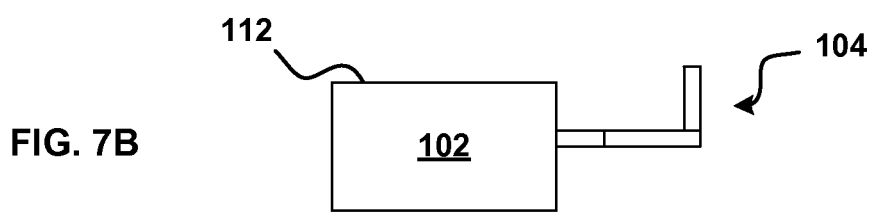
Figure 7C:
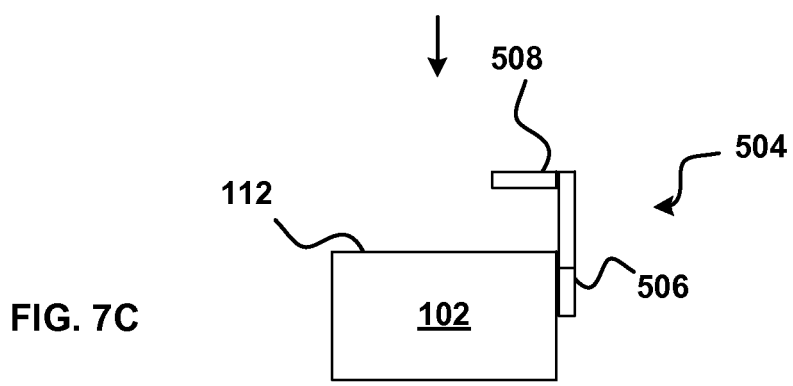

FIG. 7A-C are block diagrams illustrating exemplary steps reforming a lead 104 of FIG. 1 into lead 504 of FIG. 5, according to aspects of the invention. Only one lead 104 is shown for clarity. FIG. 7A illustrates a block diagram of typical configuration for a case 102 the TSOP 100 of FIG. 1. In FIG. 7B, a portion of the lead 104 is straightened out to the side. In FIG. 7C, the straightened lead 104 is bent upward toward the top surface 112. A vertical portion 506 is formed that extends a horizontal portion 508 above the top surface 112. The top surface 112 becomes the first surface 210 and the lead 104 of FIG. 1 becomes the lead 504 of FIG. 5. While FIGS. 7A-C illustrate various steps in reforming a lead, fewer, more, or other steps may be used to reform leads of FIG. 1 into the leads of FIG. 5.

Figure 8:
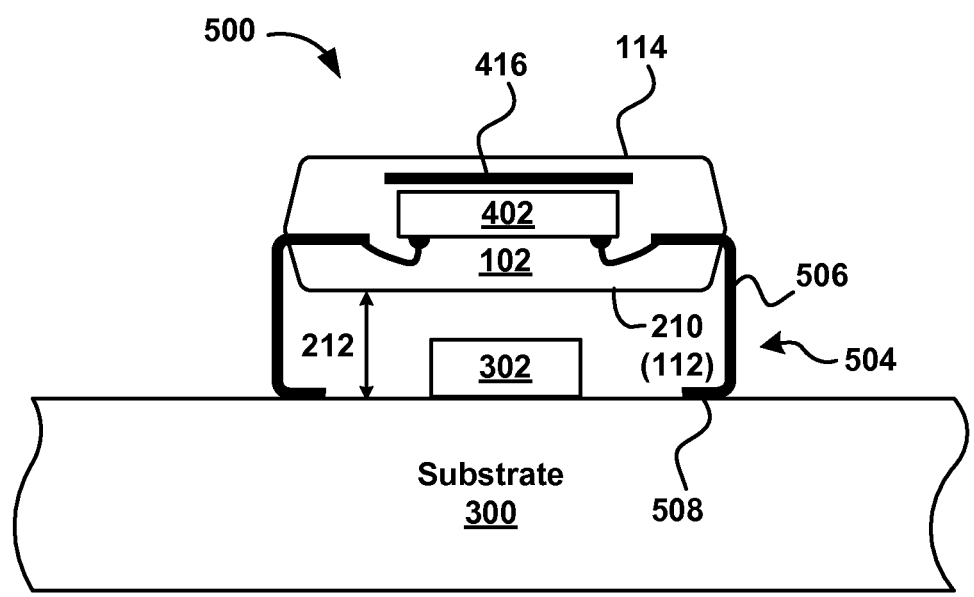
FIG. 8 illustrates a front elevation the RSOP of FIG. 5 disposed on the substrate.

FIG. 8 illustrates a front elevation the RSOP 500 of FIG. 5 disposed on the substrate 300, according to various aspects of the invention. The die attach pad 416 of the RSOP 500 is positioned up, away from the substrate, which enhances dissipation of heat away from the device 302 and away from the substrate 300. This also reduces heating of device 302 from the die 402 within the RSOP 500. Enhanced heat dissipation further enhances cooling of the die 402 inside the RSOP 500.

While the reformed RLSOP 400 of FIG. 4 and the RSOP of FIG. 5 are illustrated as being reformed from the TSOP 100, a PSOP, SSOP, TSSOP, and/or the like could be reformed into an LSOP or an RSOP. A layout of devices and traces on the substrate 300 may be configured to accommodate the higher device densities devices due to space recaptured from elimination of the extensions 110. Further, the substrate 300 layout can be configured for disposing additional devices 302 between LSOP 200, RLSOP 400, and/or RSOP 500 devices and the substrate 300. The substrate 300 layout may be configured for the reversal of the pins from the lead-frame 104 to the lead-frame 504 that accompanies inverting the RSOP 500. An RLSOP 400 and/or RSOP 500 that has been formed during manufacturing rather than being reformed (e.g., LSOP 200) may be mounted on the substrate 300. FIGS. 1-6 are not to scale.

Figure 9:
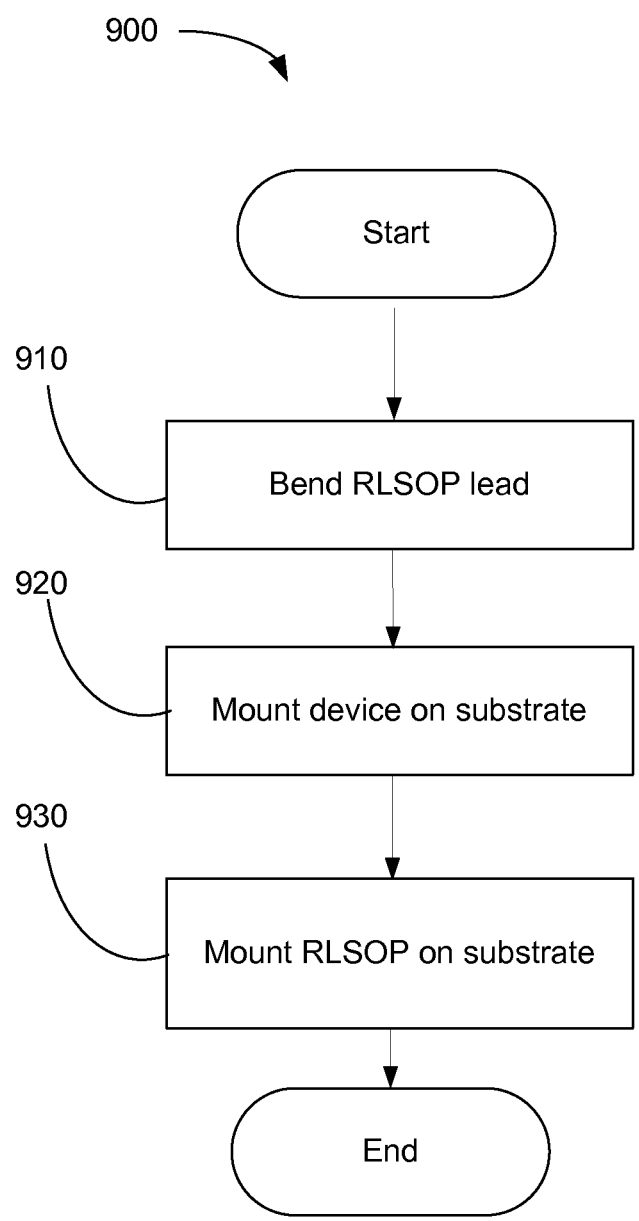
FIG. 9 is a flow diagram of an exemplary method for converting a small outline package to a reformed lead small outline package.

FIG. 9 is a flow diagram illustrating an exemplary method 900 for converting a small outline package to a reformed lead small outline package (RSLOP). The method 900 includes a bend RLSOP lead step 910, a mount device step 920, and a mount RSLOP step 930. The method 900 also describes converting a small outline package to a reverse lead small outline package (RSOP).

In the bend RSLOP step 910, a lead is bent to reform into an "L" shape having a horizontal portion and a vertical portion. The horizontal portion is about parallel to a first surface of the package. The vertical portion is configured to position the horizontal portion beyond the first surface of the package. The first surface may be a top or a bottom surface of the original package. In various embodiments, the package is a PSOP, TSOP, SSOP, TSSOP, and/or the like.

In the mount device step 920, a device is mounted on a substrate such as substrate 300. The device, such as device 302 will be under the RSLOP between the RSLOP and the substrate. In various embodiments, the device includes active components such as bare dies, Chip Scale Package (CSP), diodes, transistors, etc. and passive components as X-tal, resistors, inductors, and capacitors etc.

In the mount RSLOP step, the RSLOP is mounted on the substrate. In some embodiments, a RSOP is mounted on the substrate. The RSLOP may be mounted over the device. When the first surface is a top surface, the device is an RSOP that is inverted and then mounted on the substrate. While the method 900 includes the bend RLSOP lead step 910, mount device step 920, and mount RSLOP step 930, the method 900 may include more or fewer steps.

As used in this specification, the terms "include," "including," "for example," "exemplary," "e.g.," and variations thereof, are not intended to be terms of limitation, but rather are intended to be followed by the words "without limitation" or by words with a similar meaning. Definitions in this specification, and all headers, titles and subtitles, are intended to be descriptive and illustrative with the goal of facilitating comprehension, but are not intended to be limiting with respect to the scope of the inventions as recited in the claims. Each such definition is intended to also capture additional equivalent items, technologies or terms that would be known or would become known to a person of ordinary skill in this art as equivalent or otherwise interchangeable with the respective item, technology or term so defined. Unless otherwise required by the context, the verb "may" indicates a possibility that the respective action, step or implementation may be performed or achieved, but is not intended to establish a requirement that such action, step or implementation must be performed or must occur, or that the respective action, step or implementation must be performed or achieved in the exact manner described.

The above description is illustrative and not restrictive. This patent describes in detail various embodiments and implementations of the present invention. The present invention is open to additional embodiments and implementations, further modifications, and alternative constructions. There is no intention in this patent to limit the invention to the particular embodiments and implementations disclosed; on the contrary, this patent is intended to cover all modifications, equivalents and alternative embodiments and implementations that fall within the scope of the claims. The scope of the invention should, therefore, be determined not with reference to the above description, but instead should be determined with reference to the appended claims along with their full scope of equivalents.

What is claimed is:

1. A small outline package for supporting a semiconductor, the package comprising:
    a case enclosing the semiconductor; and
    an "L" shaped lead-frame connected to the semiconductor and supported by the case, the lead-frame having a horizontal portion attached to a substrate and a vertical portion that extends vertically adjacent to a side of the case to create a separation between the case and the horizontal portion, the separation providing clearance for mounting a device in a footprint of the case.

2. The small outline package of claim 1, further comprising:
    the substrate attached to the small outline package; and
    a device mounted on the substrate between the small outline package and the substrate.

3. The small outline package of claim 1, wherein the separation is greater than about 0.1 mm.

4. The small outline package of claim 1, wherein the vertical portion of the lead-frame is configured to invert the small outline package to mount the "L" shaped lead-frame on the substrate, and the "L" shaped lead-frame of the inverted package has a reversal of pins.

5. The small outline package of claim 1, wherein the small outline package is a plastic small outline package, a thin small outline package, a shrink small outline package, or a thin shrink small outline package.

6. An electronic device comprising:
    an integrated circuit;
    a case enclosing the integrated circuit;
    an "L" shaped lead in electronic communication with the integrated circuit, a vertical portion of the lead extending from an edge of the case about perpendicular to a first surface of the case, a horizontal portion of the lead extending inward about parallel to the first surface of the case; and
    a separation between the first surface of the case and the horizontal portion of the lead.

7. The electronic device of claim 6, further comprising a substrate attached to the case.

8. The electronic device of claim 6, wherein the first surface of the case is a top surface.

9. The electronic device of claim 6, wherein the separation between the horizontal portion of the "L" shaped lead and the first surface of the case is greater than about 0.1 mm.

10. The electronic device of claim 6, wherein the case and lead form a small outline package.

11. The electronic device of claim 10, wherein the small outline package is a plastic small outline package, a thin small outline package, a thin shrink small outline package, or a shrink small outline package.

12. A method for converting a small outline package to a reformed lead small outline package, the method comprising:
bending a lead to form an "L" shaped lead, the lead having a horizontal portion of the "L" shape extending inward about parallel to a first surface of the package and a vertical portion of the "L" shape extending vertically adjacent to a side of a case to create a separation between the case and the horizontal portion, the separation providing clearance for mounting a device in a footprint of the case.

13. The method of claim 12, further comprising mounting the reformed lead small outline package on a substrate.

14. The method of claim 13, further comprising mounting the device between the reformed lead small outline package and the substrate.

15. The method of claim 12, wherein the small outline package is a plastic small outline package, a thin small outline package, a thin shrink small outline package, or a shrink small outline package.

16. The method of claim 12, wherein a separation between the first surface of the package and the horizontal portion of the "L" shape is greater than about 0.3 mm.

17. The method of claim 12, wherein the first surface of the package is a bottom surface.

18. The method of claim 12, wherein the first surface of the package is a top surface.

19. The method of claim 18, further comprising:
inverting the reformed lead small outline package to dispose the horizontal portion of the "L" shaped lead on a substrate, the "L" shaped lead of the inverted package having a reversal of pins; and
configuring the substrate for the reversal of pins on the lead.

* * * * *